(12) United States Patent
Sasaki et al.

(10) Patent No.: US 7,256,110 B2
(45) Date of Patent: Aug. 14, 2007

(54) CRYSTAL MANUFACTURING METHOD

(75) Inventors: Shinichi Sasaki, Toda (JP); Masashi Nakamura, Toda (JP); Kenji Sato, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 339 days.

(21) Appl. No.: 10/504,527

(22) PCT Filed: Nov. 12, 2002

(86) PCT No.: PCT/JP02/11771

§ 371 (c)(1), (2), (4) Date: Aug. 16, 2004

(87) PCT Pub. No.: WO03/073484

PCT Pub. Date: Sep. 4, 2003

(65) Prior Publication Data

US 2005/0106883 A1    May 19, 2005

(30) Foreign Application Priority Data

Feb. 27, 2002    (JP) .............................. 2002-050605

(51) Int. Cl.
*H01L 21/20* (2006.01)
*H01L 21/36* (2006.01)
*C03B 25/02* (2006.01)

(52) U.S. Cl. ...................... 438/493; 438/509; 438/763; 148/DIG. 113; 117/89; 117/952

(58) Field of Classification Search ................ 438/479, 438/493, 761, 763, 509; 117/89, 105, 952; 148/DIG. 113

See application file for complete search history.

(56) References Cited

U.S. PATENT DOCUMENTS

| | | | |
|---|---|---|---|
| 5,863,811 A * | 1/1999 | Kawai et al. .................. 438/47 |
| 6,123,768 A * | 9/2000 | Moustakas ................... 117/105 |
| 6,225,195 B1 | 5/2001 | Iyechika et al. |
| 6,320,207 B1 * | 11/2001 | Furukawa et al. ........... 257/101 |
| 6,627,552 B1 * | 9/2003 | Nishio et al. ................ 438/694 |
| 6,664,650 B2 * | 12/2003 | Chung et al. ................ 257/797 |
| 6,673,149 B1 * | 1/2004 | Solomon et al. .............. 117/90 |
| 6,734,033 B2 * | 5/2004 | Emerson et al. .............. 438/29 |
| 6,977,397 B2 * | 12/2005 | Ichinose et al. ............. 257/103 |
| 7,053,420 B2 * | 5/2006 | Tadatomo et al. ............. 257/98 |
| 2002/0025661 A1 * | 2/2002 | Nikolaev et al. ............ 438/505 |
| 2002/0121642 A1 * | 9/2002 | Doverspike et al. .......... 257/97 |
| 2003/0180580 A1 * | 9/2003 | Wada et al. ................. 428/698 |
| 2003/0209705 A1 * | 11/2003 | Emerson et al. .............. 257/14 |
| 2004/0079960 A1 * | 4/2004 | Shakuda ..................... 257/103 |
| 2004/0206299 A1 * | 10/2004 | Tadatomo et al. ............. 117/84 |
| 2004/0232433 A1 * | 11/2004 | Doverspike et al. .......... 257/97 |
| 2005/0023555 A1 * | 2/2005 | Yoshida et al. ............. 257/192 |
| 2005/0221515 A1 * | 10/2005 | Yanashima et al. ........... 438/21 |
| 2005/0224782 A1 * | 10/2005 | Linga et al. .................. 257/14 |

FOREIGN PATENT DOCUMENTS

| | | |
|---|---|---|
| JP | 2000-004045 A | 1/2000 |
| WO | WO95/27815 A1 | 10/1995 |

OTHER PUBLICATIONS

J. Kozlowski et al.; MRS Internet Journal of Nitride Semiconductor Research, vol. 3, No. 27, 1998.

Kozlowski et al., MRS Internet Journal fo Nitride Semiconductor Research, vol. 3, No. 27, (1998).

* cited by examiner

*Primary Examiner*—M. Wilczewski
(74) *Attorney, Agent, or Firm*—Birch, Stewart, Kolasch & Birch, LLP

(57) ABSTRACT

A method of growing a crystal (for example, a GaN system compound semiconductor crystal) on a substrate at least includes forming a first crystalline layer (a GaN system buffer layer), forming a second crystalline layer (a GaN system intermediate layer) and forming a third crystalline layer (a GaN system thick film layer). The three crystalline layers are respectively reared on conditions different from one another.

12 Claims, No Drawings

CRYSTAL MANUFACTURING METHOD

TECHNICAL FIELD

The present invention relates to a method for producing a crystal used for the manufacturing of semiconductor devices such as a light emitting device, an electronic device and the like, particularly a GaN system compound semiconductor crystal.

BACKGROUND ART

GaN system compound semiconductors ($In_xGa_yAl_{1-x-y}N$, $0 \leq x, y; x+y \leq 1$) such as GaN, InGaN, AlGaN, InGaAlN and the like have been expected as materials of semiconductor electronic devices such as a light emitting device, a power device and the like and have been remarked as materials applicable in other various fields.

In an earlier development, it is difficult to grow a bulk crystal of the GaN system compound semiconductor. Therefore, a substrate obtained, for example, by forming a thin film single crystal such as GaN or the like on a different type crystal such as a sapphire or the like by hetero epitaxy has been used for the electronic device.

However, because lattice mismatching between a sapphire crystal and a GaN system compound semiconductor crystal is large, a dislocation density of the GaN system compound semiconductor crystal grown on the sapphire crystal becomes large. Therefore, a problem has been arisen that crystal defects are generated. Further, a sapphire has a low thermal conductivity not to easily release heat. Therefore, when a substrate having a GaN system compound semiconductor crystal grown on a sapphire crystal is used for an electronic device or the like largely consuming electric power, a problem has been arisen that the electronic device easily becomes a high temperature.

Further, the growth of a GaN system compound semiconductor crystal according to an epitaxial lateral overgrowth (ELO) method or the like using a hydride vapor phase epitaxial growth (hereinafter, abbreviated as HVPE) method has been tried. The ELO method is, for example, a method of forming an insulating film acting as a mask on a sapphire substrate, forming an opening in a portion of the insulating film to use the insulating film as the mask and growing a GaN system compound semiconductor crystal having high crystallinity while using an exposed surface of the sapphire substrate as a seed of the epitaxial growth.

In this method, the growth of the GaN system compound semiconductor crystal starts from the surface of the sapphire substrate placed on the inside of the opening formed in the mask, and a grown layer is spread on the mask. Accordingly, the dislocation density in the crystal can be suppressed to a low value, and a GaN system compound semiconductor crystal having small crystal defects can be obtained.

However, the GaN system compound semiconductor crystal obtained by the ELO method has large thermal distortion. Therefore, when the polishing is performed for the GaN crystal after the growth of the GaN crystal to separate the sapphire substrate from the GaN system compound semiconductor crystal inn order to obtain a GaN system compound semiconductor crystal wafer as a single substance, a problem has been arisen that the wafer is bended due to residual distortion.

Therefore, the inventors have proposed a method of using a rare earth 13 (3B) group perovskite crystal as one of materials of a different type crystal substrate and growing a GaN system compound semiconductor according to a hetero epitaxy while setting a {011} plane or a {101} plane of the perovskite crystal as a growth plane (No. WO95/27815). The {011} plane and the {101} plane denote a set of planes equivalent to a (011) plane and a set of planes equivalent to a (101) plane respectively.

In this growth technique of the above-described previous application, when GaN is, for example, grown on a {011} plane or a {101} plane of a substrate while using $NdGaO_3$ (hereinafter, abbreviated as NGO), which is one of the rare earth 13 (3B) group perovskites, as the substrate, the lattice mismatching is almost 1.2%. Therefore, the lattice mismatching can be considerably lowered as compared with a case where a sapphire or SiC used in place of the sapphire is used as a substrate. Accordingly, because the dislocation density in the crystal is lowered, a GaN system compound semiconductor crystal having small crystal defects can be grown.

Further, the invention obtained by modifying the technique of the previous application has been proposed (Japanese Patent Application Publication No. Tokkai 2000-4045). In this invention, a GaN thin film layer is formed on an NGO substrate at a low temperature (400 to 750° C.), heat treatment is performed for the GaN thin film layer to heat up the GaN thin film layer to a predetermined temperature in an inert gas ($N_2$ gas) atmosphere, and thereafter a GaN thick film layer is grown at a high temperature (800 to 1200° C.) on the GaN thin film layer. In this technique, because the GaN thin film layer is formed as a buffer layer before the formation of the GaN thick film layer, the buffer layer can prevent the NGO substrate from being reduced by reacting with $NH_3$ or the like at a growth temperature (800 to 1200° C.) of the GaN system compound semiconductor. Accordingly, the deterioration of a grown GaN system compound semiconductor crystal caused by the reduction of the NGO substrate can be avoided.

However, in the technique of the above-described previous application (Japanese Patent Application Publication No. Tokkai 2000-4045), it was found out that a problem was arisen that the crystal quality is degraded, because the GaN thin film layer is formed at the temperature (400 to 750° C.) considerably lower than the growth temperature (800 to 1200° C.) of the GaN thick film layer in order not to reduce the NGO substrate. Further, the GaN thin film layer (a lower temperature buffer layer) having inferior crystal quality is required to be thickly formed to prevent the NGO substrate from being reduced during the heating up to the growth temperature of the GaN thick film layer. Therefore, it was found out that a problem was arisen that the crystallinity is further degraded.

Therefore, in the method described above, though the NGO substrate can be prevented from being reduced at the growth temperature of the GaN thick film layer, it is assumed that there is a probability that the GaN thin film layer adversely influences the GaN system compound semiconductor crystal grown on the GaN thin film layer so as to lower the crystal quality of the GaN system compound semiconductor crystal.

An object of the present invention is to provide a technique where, in a GaN system compound semiconductor crystal production method using a substrate (for example, a rare earth 13 (3B) group perovskite such as NGO or the like) capable of reacting with a raw material or being degraded due to heat during the rearing of a GaN system compound semiconductor layer, the crystal quality of the GaN system compound semiconductor crystal can be enhanced by improving the quality of a GaN thin film layer formed between the substrate and a GaN system thick film layer.

DISCLOSURE OF INVENTION

In order to achieve the above object, in a method of growing a crystal on a substrate, the present invention includes at least forming the first crystalline layer, forming the second crystalline layer and forming the third crystalline layer, where the crystalline layers are respectively reared in the three processes on conditions different from one another. Particularly, when the crystalline layers are GaN system compound semiconductor layers, the method of the present invention is effective.

That is, before the third crystalline layer (a GaN system thick film layer) is formed on the substrate, the first crystalline layer (a GaN system lower temperature buffer layer) and the second crystalline layer (a GaN system intermediate layer) are formed as a thin film layer. Therefore, because the quality of the thin film layer can be enhanced, the adverse influence exerted on the quality of a thick film layer formed on the thin film layer is lessened, and the crystal quality as the entire crystal is enhanced. Further, by the formation of the thin film layer comprising the first crystalline layer (the GaN system buffer layer) and the second crystalline layer (the GaN system intermediate layer), the substrate can be prevented from being reduced by reacting with a raw material at a growth temperature of the third crystalline layer (the GaN system thick film layer).

Further, it is desired that the first, second and third crystalline layers are single crystalline layers respectively. That is, when a GaN system compound semiconductor crystal was produced, a polycrystalline lower temperature buffer layer was formed as a thin film layer in the earlier development. Therefore, there was a probability that the crystallinity of a thick film layer grown on the buffer layer was degraded. However, in the present invention, because the first crystalline layer (the GaN system lower temperature buffer layer) and the second crystalline layer (the GaN system intermediate layer) are set to be single crystals, the degradation of the crystallinity of the third crystalline layer (the GaN system thick film layer) can be prevented.

Further, it is desired that the first crystalline layer (the GaN system lower temperature buffer layer) has a film thickness within a range from 5 nm to 300 nm. It is further desired that the film thickness is within a range from 10 nm to 100 nm.

Accordingly, the substrate can be prevented from being degraded before the formation of the second crystalline layer (the GaN system intermediate layer). The film thickness of the first crystalline layer (the GaN system lower temperature buffer layer) was set within the range described above, because the first crystalline layer adversely influences the crystallinity of the third crystalline layer (the GaN system thick film layer) at the thickness exceeding this range.

Further, by forming the first crystalline layer (the GaN system lower temperature buffer layer) at a growth temperature ranging from 570° C. to 670° C., the substrate can be prevented from being degraded in a rearing process thereof.

It is desired that the film thickness of the second crystalline layer (the GaN system intermediate layer) is within a range from 0.5 μm to 50 μm. Therefore, the substrate can be prevented from being degraded before the formation of the third crystalline layer (the GaN system thick film layer). The film thickness of the second crystalline layer (the GaN system intermediate layer) was set within the range described above, because the second crystalline layer adversely influences the crystallinity of the third crystalline layer (the GaN system thick film layer) at the thickness exceeding this range.

Further, by forming the second crystalline layer (the GaN system intermediate layer) at a growth temperature ranging from 750° C. to 850° C., the substrate can be prevented from being degraded in a rearing process of the second crystalline layer.

It is desired that the growth temperature of the third crystalline layer (the GaN system thick film layer) is within a range from 950° C. to 1050 C.

Further, in forming the third crystalline layer (the GaN system thick film layer), it is preferable that, after a rearing process of the second crystalline layer (the GaN system intermediate layer) is completed, the second crystalline layer is maintained at a temperature equal to or higher than the growth temperature of the second crystalline layer (the GaN system intermediate layer) (for example, the growth temperature of the third crystalline layer) for a time ranging from twenty minutes to four hours, and then the growth of the third crystalline layer (the GaN system thick film layer) is started.

That is, by annealing the first and second crystalline layers at the growth temperature of the third crystalline layer (the GaN system thick film layer) or a temperature close to the growth temperature before the third crystalline layer is grown, the crystallinity of the first and second crystalline layers (a GaN system thin film layer (the lower temperature buffer layer and the intermediate layer)) already formed are improved. Accordingly, the crystallinity of the third crystalline layer (the GaN system thick film layer) formed onto them can be enhanced.

The method described above is particularly effective when the substrate easily reacts with a raw material(s) used for the rearing of the first, second and/or third crystalline layer(s) or is easily degraded due to heat. For example, as the substrate, there are a rare earth 13 (3B) group perovskite crystal including one or two rare earth elements or more and represented by NGO and the like.

BEST MODE FOR CARRYING OUT THE INVENTION

Hereinafter, a preferred embodiment according to the present invention will be described in a case where a GaN compound semiconductor crystal is grown while using an NGO crystal as a substrate. In this embodiment, an ingot of NGO is sliced to form a substrate for crystal growth. The size of the NGO substrate is 50 mm in diameter and 0.5 mm in thickness.

EXAMPLE

A method of forming a GaN thin film on an NGO substrate according to the present invention and growing GaN compound semiconductor crystals on the GaN thin film will be described.

Initially, ultrasonic cleaning was performed for the mirror-polished NGO substrate in acetone for five minutes, and subsequently in methanol for another five minutes. Thereafter, the NGO substrate was blown with $N_2$ gas to blow away drops of liquid and was naturally dried. Then, the cleaned NGO substrate was etched with sulfuric type etchant (phosphoric acid:sulfuric acid=1:3, 80° C.) for five minutes.

Then, after the NGO substrate was placed at a predetermined position in a hydride VPE apparatus, the temperature of the substrate was heated up to 620° C. while introducing an $N_2$ gas, GaCl produced from Ga metal and an HCl gas and $NH_3$ were supplied on the NGO substrate by using an $N_2$ carrier gas, and a GaN buffer layer of almost 40 nm was formed as a first crystalline layer. At this time, an amount of each introduced gas was controlled so as to be a GaCl partial pressure of $8 \times 10^{-3}$ atm and to be an $NH_3$ partial pressure of 0.15 atm. The introduction of raw material gases in following processes was controlled in the same manner.

Then, the supply of the raw material gases was once stopped, and the temperature of the substrate was heated up to 800° C. while introducing $N_2$. Thereafter, GaCl and $NH_3$ acting as raw material gases were supplied onto the NGO substrate by using the $N_2$ carrier gas, and a GaN intermediate layer of almost 10 μm thickness was formed as a second crystalline layer.

Thereafter, the supply of the raw material gases was stopped again, and the temperature of the substrate was heated up to 1000° C. while introducing $N_2$. Then, this condition was kept for sixty minutes to anneal the GaN intermediate layer. Accordingly, because the crystallinity of the GaN intermediate layer can be enhanced, a GaN thick film layer having superior quality can be formed on the GaN intermediate layer.

Then, GaCl and $NH_3$ acting as raw material gases were supplied onto the NGO substrate by using the $N_2$ carrier gas, and a GaN thick film layer was formed as a third crystalline layer. In this case, a crystal growth rate was almost 50 μm/h, and the crystal growth rate was continued for four hundreds and eighty minutes.

Thereafter, the layers were cooled at a cooling rate of 5° C./min, and a GaN compound semiconductor crystal having a film thickness of almost 400 μm was obtained.

When the GaN compound semiconductor crystal was grown by using this substrate, a full-width half-maximum (FWHM) of an X-ray locking curve in the obtained GaN compound semiconductor crystal ranged from 180 to 300 seconds. Therefore, it was ascertained that the obtained GaN compound semiconductor crystal had superior crystal quality.

COMPARATIVE EXAMPLE

Next, as a comparative example, a method of forming a GaN thin film on the NGO substrate according to an earlier developed method and growing a GaN compound semiconductor crystal on the GaN thin film will be described.

The comparative example differs from the above-described example in the point that no GaN intermediate layer is formed, and the post-treatment of the NGO substrate, the growth condition of the GaN compound semiconductor crystal and the like were performed in the same manner as in the example.

Initially, ultrasonic cleaning was performed for the mirror-polished NGO substrate in acetone for five minutes, and subsequently in methanol for another five minutes. Thereafter, the NGO substrate was blown with $N_2$ gas to blow away droplets of liquid and was naturally dried. Then, the cleaned NGO substrate was etched with sulfuric type etchant (phosphoric acid:sulfuric acid=1:3, 80° C.) for five minutes.

Then, after the NGO substrate was placed at a predetermined position in a hydride VPE apparatus, the temperature of the substrate was heated up to 620° C. while introducing $N_2$ gas, GaCl produced from Ga metal and an HCl gas and $NH_3$ were supplied onto the NGO substrate by using an $N_2$ carrier gas, and a GaN buffer layer of almost 100 nm was formed. In this process, an amount of each introduced gas was controlled so as to be a GaCl partial pressure of $5.0 \times 10^{-3}$ atm and to be an $NH_3$ partial pressure of $3.0 \times 10^{-1}$ atm. The introduction of raw material gases in following processes was controlled in the same manner.

Then, the supply of the raw material gases was once stopped, and the temperature of the substrate was heightened to 1000° C. while introducing $N_2$. Thereafter, GaCl and $NH_3$ acting as raw material gases were supplied on the NGO substrate by using the $N_2$ carrier gas, and a GaN thick film layer was formed. In this process, a crystal growth rate was almost 40 μm/h, and the crystal growth rate was continued for three hundreds minutes.

Thereafter, the layers were cooled at a cooling rate of 5.3° C./min for ninety minutes, and a GaN compound semiconductor crystal having a film thickness of almost 200 μm was obtained.

When the GaN compound semiconductor crystal was grown by using this substrate, a full-width half-maximum (FWHM) of an X-ray locking curve in the obtained GaN compound semiconductor crystal is 1000 seconds. Therefore, the crystal quality of this GaN compound semiconductor crystal was inferior in comparison with that of the GaN compound semiconductor crystal of the described-above example.

The invention performed by the inventors was concretely described according to the embodiment. However, the present invention is not limited thereto.

For example, the growth temperature of the GaN compound semiconductor may be controlled within the range from 570° C. to 670° C. in the GaN system buffer layer forming process, be controlled within the range from 750° C. to 850° C. in the GaN system intermediate layer forming process and be controlled within the range from 950° C. to 1050° C. in the GaN system thick film layer forming process.

Further, the GaN system buffer layer is desirably formed at the film thickness ranging from 5 nm to 300 nm, and the GaN system intermediate layer is preferably formed at the film thickness ranging from 0.5 μm to 50 μm. By setting the film thickness of a GaN system thin film layer (the buffer layer and the intermediate layer) within the range described above, the NGO substrate can be prevented from being degraded by reacting with $NH_3$ or the like due to an excessively thin GaN system thin film layer, and an adverse influence of an excessively thick GaN system thin film layer on the crystallinity of the GaN system thick film layer can be prevented.

Moreover, an annealing time after forming the GaN system intermediate layer may be adjusted within a range from 20 minutes to four hours.

Furthermore, as growth conditions of the GaN system compound semiconductor crystal, the GaCl partial pressure of from $1.0 \times 10^{-3}$ to $1.0 \times 10^{-2}$ atm, the $NH_3$ partial pressure of from $1.0 \times 10^{-1}$ to $4.0 \times 10^{-1}$ atm, the growth rate of from 30 to 100 μm/h, the growth temperature of from 930 to 1050° C. and the cooling rate of from 4 to 10° C./min are desirable.

According to the present invention, a method of using a substrate which reacts with a raw material gas or is degraded due to heat and growing a crystal (for example, a GaN system compound semiconductor crystal) on a surface of the substrate at least includes forming the first crystalline layer (a GaN system buffer layer), forming the second crystalline layer (a GaN system intermediate layer) and forming the third crystalline layer (a GaN system thick film layer), where the crystalline layers are respectively reared on conditions different from one another. Accordingly, the quality of a thin film layer composed of the first crystalline layer (the GaN system buffer layer) and the second crystalline layer (the GaN system intermediate layer) can be enhanced, no adverse influence is given to the quality of the third crystalline layer (the GaN system thick film layer) formed on the thin film layer, and the crystal quality as the entire crystal can be enhanced. Further, by forming the first and second crystalline layers (a GaN system thin film layer), the NGO substrate can be prevented from being reduced by reacting with $NH_3$ included in one of raw materials at a growth temperature of the third crystalline layer (the GaN system thick film layer).

INDUSTRAIL APPLICABILITY

A multi-step type growth according to the present invention can be applied when not only a GaN system compound semiconductor crystal and but also other crystals are grown.

The invention claimed is:

1. A crystal producing method for growing a GaN system compound semiconductor crystal on a substrate, at least comprising:
   forming a first GaN system compound semiconductor crystalline layer on the substrate at a growth temperature ranging from 570° C. to 670° C.;
   forming a second GaN system compound semiconductor crystalline layer on the first GaN system compound semiconductor crystalline layer at a growth temperature ranging from 750° C. to 850° C.; and
   forming a third GaN system compound semiconductor crystalline layer on the second GaN system compound semiconductor crystalline layer at a growth temperature ranging from 950° C. to 1050° C.

2. The crystal producing method as claimed in claim 1, wherein the first GaN system compound semiconductor crystalline layer is formed at a film thickness ranging from 5 nm to 300 nm.

3. The crystal producing method as claimed in claim 1, wherein the second GaN system compound semiconductor crystalline layer is formed at a film thickness ranging from 0.5 μm to 50 μm.

4. The crystal producing method as claimed in claim 1, wherein the substrate is degraded by a raw material used for growth of the first, second or third GaN system compound semiconductor crystalline layer or due to heat.

5. The crystal producing method as claimed in claim 1, wherein the substrate is a rare earth 13 (3B) group perovskite crystal including one or two or more rare earth elements.

6. A crystal producing method for growing a GaN system compound semiconductor crystal on a substrate, at least comprising:
   forming a first GaN system compound semiconductor crystalline layer on the substrate at a growth temperature ranging from 570° C. to 670° C.;
   forming a second GaN system compound semiconductor crystalline layer on the first GaN system compound semiconductor crystalline layer at a growth temperature ranging from 750° C. to 850° C.; and
   forming a third GaN system compound semiconductor crystalline layer on the second GaN system compound semiconductor crystalline layer at a growth temperature ranging from 950° C. to 1050° C.
   wherein the first, second and third GaN system compound semiconductor crystalline layers are single crystalline layers respectively.

7. The crystal producing method as claimed in claim 6, wherein the first GaN system compound semiconductor crystalline layer is formed at a film thickness ranging from 5 nm to 300 nm.

8. The crystal producing method as claimed in claim 6, wherein the second GaN system compound semiconductor crystalline layer is formed at a film thickness ranging from 0.5 μm to 50 μm.

9. The crystal producing method as claimed in claim 6, wherein the substrate is degraded by a raw material used for growth of the first, second or third GaN system compound semiconductor crystalline layer or due to heat.

10. A crystal producing method for growing a GaN system compound semiconductor crystal on a substrate, at least comprising:
    forming a first GaN system compound semiconductor crystalline layer on the substrate at a growth temperature ranging from 570° C. to 670° C.;
    forming a second GaN system compound semiconductor crystalline layer on the first GaN system compound semiconductor crystalline layer at a growth temperature ranging from 750° C. to 850° C.; and
    forming a third GaN system compound semiconductor crystalline layer on the second GaN system compound semiconductor crystalline layer at a growth temperature ranging from 950° C. to 1050° C.
    wherein, after a rearing process of the second GaN system compound semiconductor crystalline layer is completed, a temperature is kept equal to or higher than a growth temperature of the second GaN system compound semiconductor crystalline layer for a time ranging from twenty minutes to four hours, and subsequently growth of the third GaN system compound semiconductor crystalline layer is started in the process of forming the third GaN system compound semiconductor crystalline layer.

11. A crystal producing method for growing a GaN system compound semiconductor crystal on a substrate, at least comprising:
    forming a first GaN system compound semiconductor crystalline layer on the substrate at a growth temperature ranging from 570° C. to 670° C.;
    forming a second GaN system compound semiconductor crystalline layer on the first GaN system compound semiconductor crystalline layer at a growth temperature ranging from 750° C. to 850° C.; and
    forming a third GaN system compound semiconductor crystalline layer on the second GaN system compound semiconductor crystalline layer at a growth temperature ranging from 950° C. to 1050° C.
    wherein, after a rearing process of the second GaN system compound semiconductor crystalline layer is completed, a temperature is kept equal to or higher than a growth temperature of the second GaN system compound semiconductor crystalline layer for a time ranging from twenty minutes to four hours, and subsequently growth of the third GaN system compound semiconductor crystalline layer is started in the process of forming the third GaN system compound semiconductor crystalline layer, and wherein the first GaN system compound semiconductor crystalline layer is formed at a film thickness ranging from 5 nm to 300 nm.

12. The A crystal producing method for growing a GaN system compound semiconductor crystal on a substrate, at least comprising:
    forming a first GaN system compound semiconductor crystalline layer on the substrate at a growth temperature ranging from 570° C. to 670° C.;
    forming a second GaN system compound semiconductor crystalline layer on the first GaN system compound semiconductor crystalline layer at a growth temperature ranging from 750° C. to 850° C.; and forming a third GaN system compound semiconductor crystalline layer on the second GaN system compound semiconductor crystalline layer at a growth temperature ranging from 950° C. to 1050° C.

wherein, after a rearing process of the second GaN system compound semiconductor crystalline layer is completed, a temperature is kept equal to or higher than a growth temperature of the second GaN system compound semiconductor crystalline layer for a time ranging from twenty minutes to four hours, and subsequently growth of the third GaN system compound semiconductor crystalline layer is started in the process of forming the third GaN system compound semiconductor crystalline layer, and wherein the second GaN system compound semiconductor crystalline layer is formed at a film thickness ranging from 0.5 μm to 50 μm.

* * * * *

UNITED STATES PATENT AND TRADEMARK OFFICE
CERTIFICATE OF CORRECTION

PATENT NO. : 7,256,110 B2
APPLICATION NO. : 10/504527
DATED : August 14, 2007
INVENTOR(S) : Shinichi Sasaki et al.

It is certified that error appears in the above-identified patent and that said Letters Patent is hereby corrected as shown below:

In the Claims:

In Column 7, Claim 1, line 22:

"570°C. to 670°C.;" should read --570°C to 670°C;--

In Column 7, Claim 1, line 26:

"750°C. to 850°C.;" should read --750°C to 850°C;--

In Column 7, Claim 1, line 30:

"950°C. to 1050°C." should read --950°C to 1050°C.--

In Column 7, Claim 6, line 51 :

"570°C. to 670°C.;" should read --570°C to 670°C;--

In Column 7, Claim 6, line 55:

"750°C. to 850°C.;" should read --750°C to 850°C;--

In Column 7, Claim 6, line 59:

"950°C. to 1050°C." should read --950°C to 1050°C.--

In Column 8, Claim 10, line 14:

"570°C. to 670°C.;" should read --570°C to 670°C;--

In Column 8, Claim 10, line 18:

"750°C. to 850°C.;" should read --750°C to 850°C;--

In Column 8, Claim 10, line 22:

"950°C. to 1050°C." should read --950°C to 1050°C.--

In Column 8, Claim 11, line 38:

"570°C. to 670°C.;" should read --570°C to 670°C;--

UNITED STATES PATENT AND TRADEMARK OFFICE
CERTIFICATE OF CORRECTION

PATENT NO. : 7,256,110 B2
APPLICATION NO. : 10/504527
DATED : August 14, 2007
INVENTOR(S) : Shinichi Sasaki et al.

It is certified that error appears in the above-identified patent and that said Letters Patent is hereby corrected as shown below:

In Column 8, Claim 11, line 42:

"750°C. to 850°C.;" should read --750°C to 850°C;--

In Column 8, Claim 11, line 46:

"950°C. to 1050°C." should read --950°C to 1050°C.--

In Column 8, Claim 12, line 60:

"The A crystal" should read --A crystal--

In Column 8, Claim 12, line 65:

"570°C. to 670°C.;" should read --570°C to 670°C;--

In Column 9, Claim 12, line 2:

"750°C. to 850°C.;" should read --750°C to 850°C;--

In Column 9, Claim 12, line 6:

"950°C. to 1050°C." should read --950°C to 1050°C.--

Signed and Sealed this

Ninth Day of June, 2009

JOHN DOLL
*Acting Director of the United States Patent and Trademark Office*